(12) United States Patent
Nedjimi et al.

(10) Patent No.: US 12,261,275 B2
(45) Date of Patent: Mar. 25, 2025

(54) METHOD THAT CONSISTS TO GIVE A SECOND LIFE TO USED ELECTRIC VEHICLE BATTERY PACKS BY REUSING THEM AS A POWER SOURCE FOR A BATTERY CHARGER

(71) Applicant: VOLVO CONSTRUCTION EQUIPMENT AB, Eskilstuna (SE)

(72) Inventors: Ahcene Nedjimi, Lyons (FR); Lilian Bruyere, Belley (FR); Pierrick Ray, Morestel (FR)

(73) Assignee: VOLVO CONSTRUCTION EQUIPMENT AB, Eskilstuna (SE)

( * ) Notice: Subject to any disclaimer, the term of this patent is extended or adjusted under 35 U.S.C. 154(b) by 558 days.

(21) Appl. No.: 17/597,203

(22) PCT Filed: Jul. 4, 2019

(86) PCT No.: PCT/EP2019/068010
§ 371 (c)(1),
(2) Date: Dec. 29, 2021

(87) PCT Pub. No.: WO2021/001045
PCT Pub. Date: Jan. 7, 2021

(65) Prior Publication Data
US 2022/0311067 A1    Sep. 29, 2022

(51) Int. Cl.
*H01M 10/54*    (2006.01)
*G01R 31/387*    (2019.01)
(Continued)

(52) U.S. Cl.
CPC .......... *H01M 10/54* (2013.01); *G01R 31/387* (2019.01); *G01R 31/392* (2019.01);
(Continued)

(58) Field of Classification Search
CPC .............. H01M 10/54; H01M 2220/20; G01R 31/387; G01R 31/392; G01R 31/396;
(Continued)

(56) References Cited

U.S. PATENT DOCUMENTS 9,079,505 B1    7/2015    Hyde et al.
2009/0027056 A1*    1/2009    Huang ................ G01R 31/392
                                                                320/132
(Continued)

FOREIGN PATENT DOCUMENTS

CN    105676139 A    6/2016
CN    205882109 U    1/2017
(Continued)

OTHER PUBLICATIONS

Machine Translation of WO2018077543 (Jun. 14, 2024) (Year: 2024).*
(Continued)

*Primary Examiner* — Matthew J Merkling
(74) *Attorney, Agent, or Firm* — Venable LLP; Jeffri A. Kaminski

(57) ABSTRACT

The invention relates to a method that consists to give a second life to used electric vehicle battery packs by reusing them as a power source for an autonomous battery charger, preferably for a mobile battery charger. The method includes successive steps consisting in: a) selecting, among battery packs that have been removed from electric vehicles, at least two battery packs; b) balancing the voltage between the selected battery packs, in order that the selected battery packs have the same State Of Charge (SOC); and c) integrating the selected battery packs (11, 12) into the battery charger.

16 Claims, 3 Drawing Sheets

(51) Int. Cl.
  *G01R 31/392* (2019.01)
  *G01R 31/396* (2019.01)
  *H02J 7/00* (2006.01)
  *H02J 7/34* (2006.01)

(52) U.S. Cl.
  CPC .......... *G01R 31/396* (2019.01); *H02J 7/0014* (2013.01); *H02J 7/0048* (2020.01); *H02J 7/0069* (2020.01); *H01M 2220/20* (2013.01); *H02J 7/342* (2020.01)

(58) Field of Classification Search
  CPC ...... H02J 7/0048; H02J 7/0069; H02J 7/0014; H02J 7/342
  See application file for complete search history.

(56) References Cited

U.S. PATENT DOCUMENTS

| | | | | |
|---|---|---|---|---|
| 2014/0159664 | A1* | 6/2014 | Yoshida | H01M 10/54 320/116 |
| 2014/0211490 | A1* | 7/2014 | Sharpley | B60Q 1/0029 362/485 |
| 2015/0367743 | A1 | 12/2015 | Lin et al. | |
| 2020/0249280 | A1* | 8/2020 | Myung | G01R 31/374 |
| 2022/0314837 | A1* | 10/2022 | Gupta | H01M 10/6567 |

FOREIGN PATENT DOCUMENTS

| | | | | |
|---|---|---|---|---|
| EP | 1389582 | A2 * | 2/2004 | ............ B64G 1/425 |
| WO | WO-2018077543 | A1 * | 5/2018 | |

OTHER PUBLICATIONS

International Search Report and Written Opinion dated Apr. 23, 2020 in corresponding International PCT Application No. PCT/EP2019/068010, 9 pages.

Dexter M T J Williams et al: "Repurposing used electric vehicle batteries for energy storage of renewable energy in the power system", Electrical&Computer Engineering (CCECE), 2012 25th IEEE Canadian Conference on, IEEE, Apr. 29, 2012 (Apr. 29, 2012), pp. 1-6, XP032257070, ISSN: 0840-7789, DOI: 10.1109/CCECE.2012.6334948 ISBN: 978-1-4673-1431-2, p. 1, left-hand column, line 16—right-hand column, line 2.

Hart P J et al: "Modeling of second-life batteries for use in a CERTS microgrid", 2014 Power and Energy Conference at Illinois (PECI), IEEE, Feb. 28, 2014 (Feb. 28, 2014), pp. 1-8, XP032590607, DOI: 10.1109/PECI.2014.6804554 [retrieved on Apr. 22, 2014], p. 1, left-hand column, line 19—right-hand column, line 9.

DC equipment maintenance job skills training materials; Sichuan Electric Power Industry Bureau; Editor-in-Chief Xu Zailin, 18 pages.

* cited by examiner

METHOD THAT CONSISTS TO GIVE A SECOND LIFE TO USED ELECTRIC VEHICLE BATTERY PACKS BY REUSING THEM AS A POWER SOURCE FOR A BATTERY CHARGER

CROSS-REFERENCE TO RELATED APPLICATIONS

This application is a U.S. National Stage application of PCT/EP2019/068010, filed Jul. 4, 2019, and published on Jan. 7, 2021, as WO 2021/001045 A1, all of which is hereby incorporated by reference in its entirety.

TECHNICAL FIELD

The invention relates to a method that consists to give a second life to used electric vehicle battery packs by reusing them as a power source for a battery charger.

The invention is applicable on working machines within the fields of industrial construction machines or construction equipment, in particular excavators. Although the invention will be described with respect to an excavator, the invention is not restricted to this particular machine, but may also be used in other working machines such as articulated haulers, wheel loaders and backhoe loaders.

Also, it could be envisaged to apply the method of the invention to other types of vehicles, such as trucks or buses.

BACKGROUND

In the automotive industry, plug-in hybrid powertrains and full-electric vehicles are known to include one or more rechargeable battery packs.

Generally speaking, during the lifetime of a battery, its performance or State of Health (SoH) have a tendency to be deteriorated gradually due to irreversible physical and chemical changes. This happens with usage and with aging phenomenon until the battery could not be longer usable or dead. The state-of-health is necessary and important for battery performance evaluation and lifetime prediction. A reliable state-of-health estimation is essential to help batteries work in a safe and suitable condition.

The SoH is an indication of a level that has been reached in the battery life cycle and a measure of its state compare to a battery that is new. The purpose of the battery SoH is therefore to provide an indication of the battery performance or in other words, the useful lifetime of the battery that has been consumed and how much remains before it has to be replaced.

The SoH of a battery pack is measured in percentage, it is generally 100% for a new battery. When the SoH of the battery drops below a certain threshold, for example 50%, then the battery pack is no longer considered compatible with the original use for which it was intended. The old battery pack is then generally replaced by a new one.

The trend towards electrification of vehicles is also affecting construction equipment. This has even become an imperative in some calls for tenders, particularly in the Nordic countries in Europe, which are very committed to ecology. Also, electrical construction equipment are highly appreciated for their low noise level, which makes them particularly suitable for small construction sites, such as home gardens (landscape work).

Usually, old (or deficient) battery packs enter in a recycling process wherein they are dismantled to separate and treat the different subcomponents. Typically, a battery pack may include one or more battery modules and a battery module includes a plurality of battery cells. The idea is to sort between battery cells that can be reused and those that cannot. Battery cells that can be reused are then re-arranged to build a new battery pack that can be, in turn, reused as a power source in an electric or hybrid vehicle.

Unfortunately, such a dismantlement and rebuilding process is very expensive and battery packs that are rebuilt cannot provide the same performance as a completely new battery pack, i.e. that has not been rebuilt from former battery cells.

It therefore appears that there is still room for improving the recycling process of used power battery packs that have been removed from electric or hybrid vehicles.

SUMMARY

One objective of the invention is to propose a less expensive and less tedious way to take advantage of old battery packs that have been removed from vehicles, i.e. battery packs that are no longer compatible with the use for which they were originally intended.

The object is achieved by the method according to claim 1.

The idea in the invention is to give a second life to the battery packs of electric vehicles, by using them in a battery charger. Indeed, we know that the battery packs of an electric vehicle need, by definition, to be recharged in order to function. They undergo charging and discharging cycles over time.

However, on construction sites, there is no charging station for recharging electric construction equipment. Generally, the construction vehicles are recharged during the night before the working day. However, if the construction equipment is used intensively, it may happen that the battery packs of it do not last all day.

One solution is to recharge the battery packs using the power grid, thanks to an adapter device. However, this is sometimes impossible (for example because there is no point of connection nearby). In this case, a generator is usually used, although this is meaningless because the initial objective is not to use fossil energy.

Battery packs contained inside an autonomous charger are less subject to torque peaks, and therefore to the intensity required, than those mounted in a hybrid (rechargeable) or electric vehicle, because the latter are subjected to acceleration and deceleration cycles (dynamic application). On the contrary, the battery packs used inside a stand-alone charger always deliver substantially the same current intensity, so that they are much less solicited (static application). We can therefore afford to use batteries with a lower capacity, precisely like those that are no longer compatible with a dynamic application, but are compatible with a static application. To do this, "old" hybrid or electric vehicle battery packs are ideal.

In other words, even if the SoH of a battery pack is no more high enough for a given application, it may be high enough for another application. Typically, when the SoH of a battery pack on-board of a vehicle falls below a given threshold SoH value, the battery pack needs to be replaced. However, the SoH level of the removed battery pack (the old one) remains sufficient to use the battery pack as a source of power in a battery charger.

Owing to the claimed method, the battery packs are prepared so that they have the same state of charge before they are integrated into a charger. Also, the removed battery packs can be used as an electric power source of the battery charger as such, that is to say without being obliged to dismantle each battery pack in order to separate reusable battery cells from non-reusable battery cells. This is obviously less tedious.

Claims 2 to 12 define further aspects of the method, which are advantageous but not compulsory.

The invention also concerns an autonomous battery charger according to claim 13.

Claim 14 defines a further aspect of the charger, which is advantageous but not compulsory.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

Figure 1:
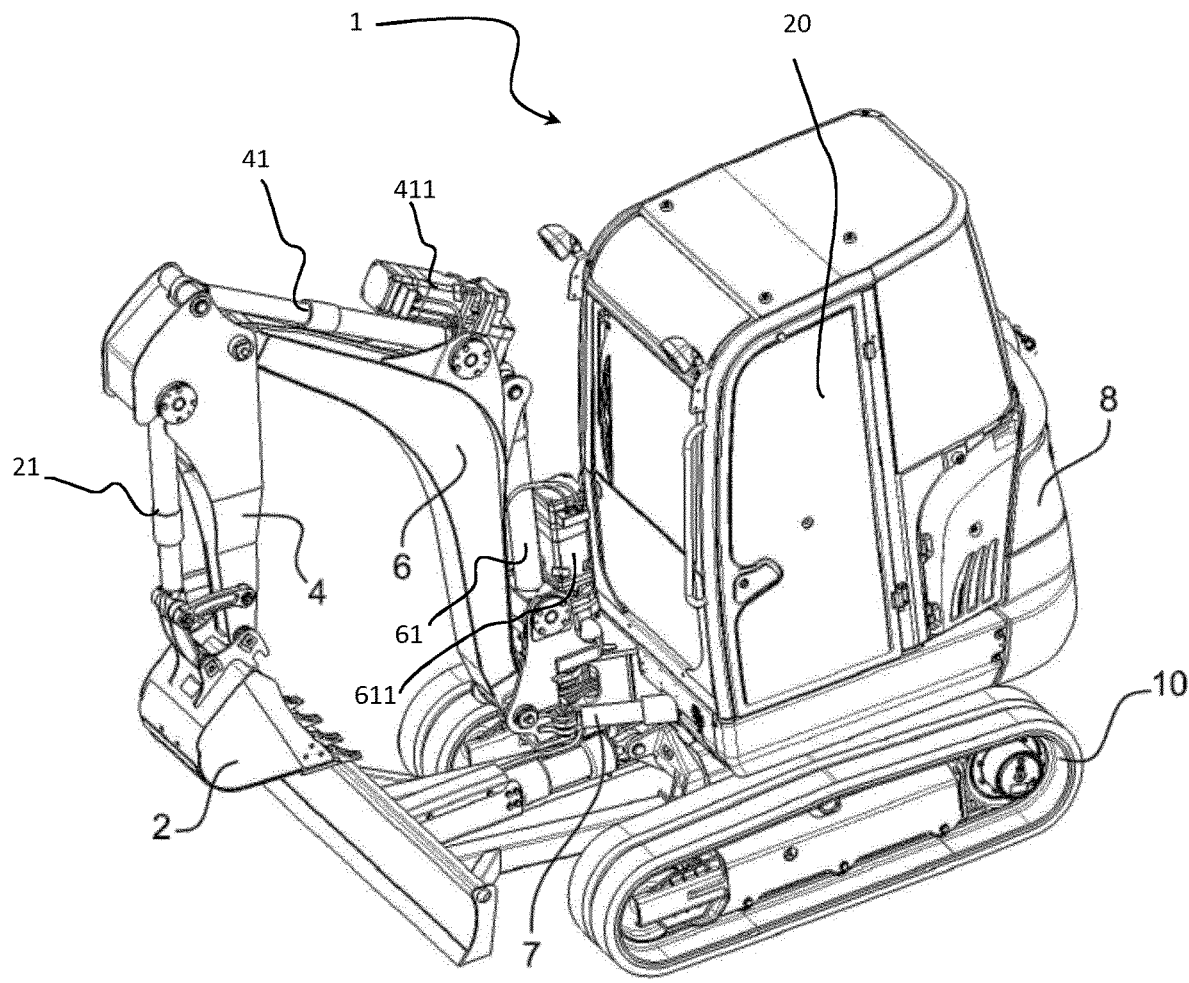
FIG. 1 represents construction equipment vehicle.

FIG. 1 illustrates an electric construction equipment vehicle, referred hereinafter as the vehicle 1. In the example, the vehicle 1 is a mechanical shovel. It includes several movable members, in particular:
a tool 2 configured to work on a site,
an arm 4 configured to move tool 2,
a boom 6 configured to move arm 4,
a swing member 8 (main body) configured to swing boom 6,
an offset member 7, and
drive members 10 that enable to displace swing member 8 with respect to the ground.

Each movable member(s) 2, 4, 6, 8, 10 is configured to bear and move a respective part of vehicle 1. When the vehicle 1 is in service, the arm 4 moves tool 2, boom 6 moves arm 4, swing member 8 moves boom 6 and drive members 10 move swing member 8.

Tool 2 and arm 4 can be linked by an articulation, e.g. a hinge, which enables at least a rotation of tool 2 relative to arm 4. Arm 4 and boom 6 can be linked by an articulation, e.g. a hinge, which enables at least a rotation of arm 4 relative to boom 6. Boom 6 and swing member 8 can be linked by an articulation, e.g. a hinge, which enables at least a rotation of boom 6 relative to swing member 8.

Swing member 8 is configured to swing boom 6 about a swing axis which is substantially vertical when vehicle 1 lies on an horizontal surface.

Swing member 8 comprises a rotating platform provided with a cab 20 for accommodating an operator. Cab 20 is configured to accommodate the operator and command devices (not represented) through which the operator can control the vehicle. Command devices may, for instance, comprise a joystick (or handle) remotely connected to a control unit (not represented) to control each movable member 2, 4, 6, 8, 10.

Preferably, drive members 10 comprise two caterpillar tracks for driving the vehicle 1. Alternatively or supplementary to caterpillar tracks, drive member 10 comprise wheels.

Advantageously, the vehicle 1 includes a motion sensor unit for each movable member 2, 4, 6, 8, 10. Also; the vehicle 1 includes electric actuators 21, 41, 61 comprising each at least one electric motor 211, 411, 611.

Figure 3:
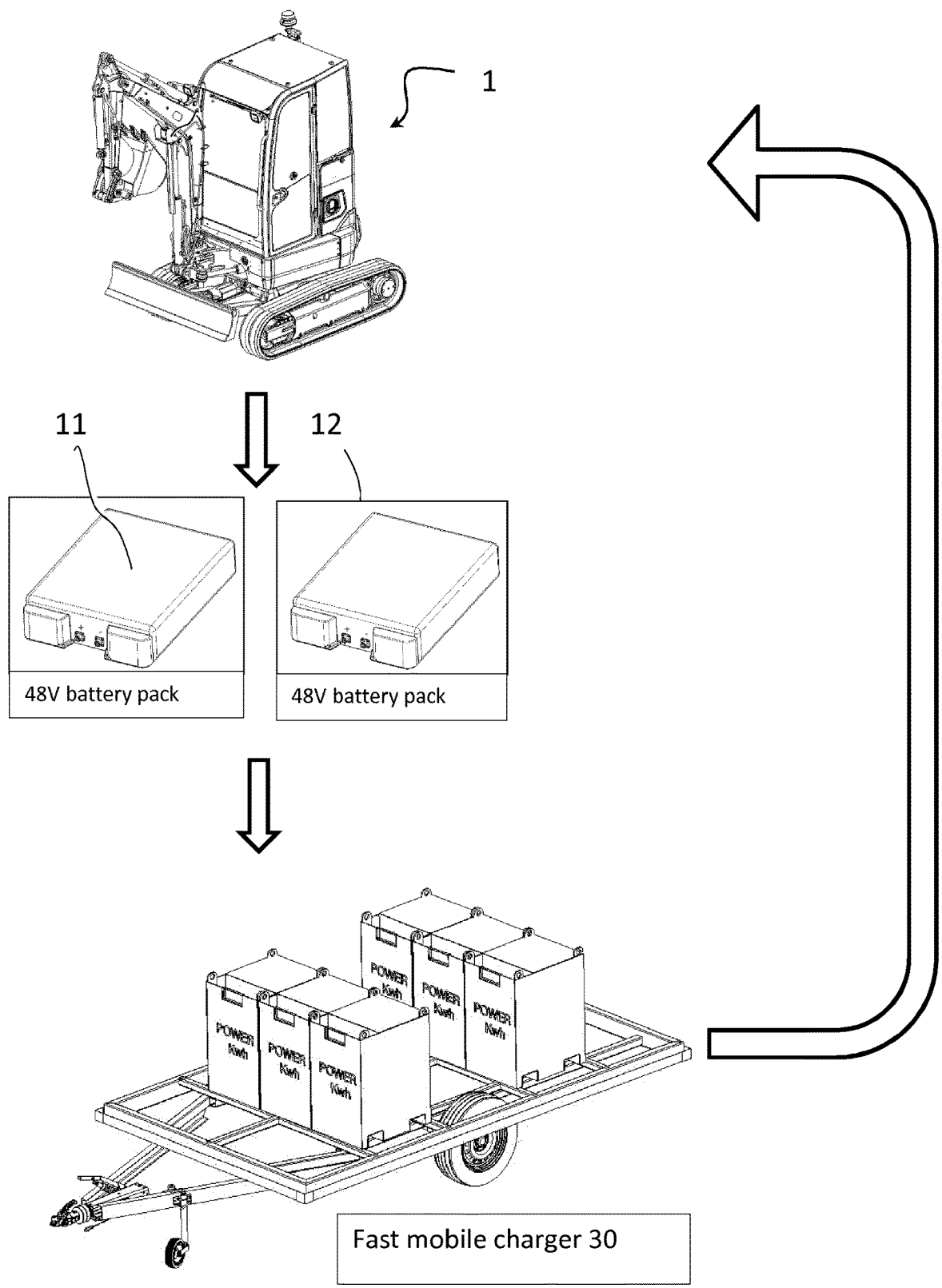
FIG. 3 represents a system comprising a construction equipment vehicle, a portable battery charger and several battery packs.

The electric motors 211, 411, 611 are powered by a set of rechargeable battery packs comprising at least a first rechargeable battery pack 11 and a second rechargeable battery pack 12 (see FIG. 3).

Rechargeable battery packs 11, 12 are preferably mounted on the swing member 8 of the vehicle, behind or below the cab 20.

The battery packs 11, 12 are obviously removable. For instance, the battery packs 11, 12 are installed into racks (not represented) so that the battery packs 11, 12 are engaged into the racks following a sliding motion. Advantageously, the rechargeable battery packs 11, 12 are automatically connected or plugged with respective electrical connectors when they are completely engaged into the racks.

Figure 2:
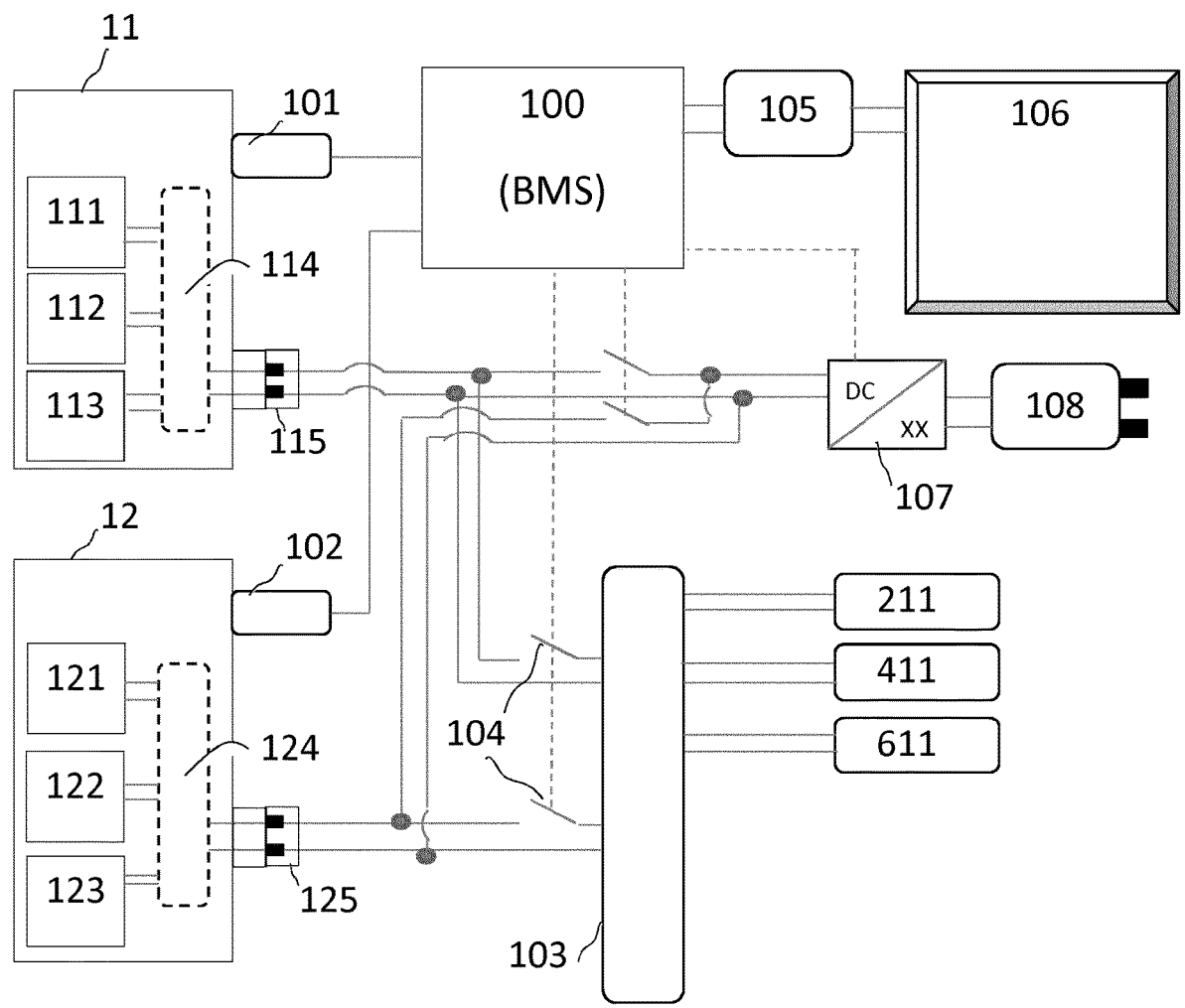
FIG. 2 represents an electric circuit connecting battery packs to electric motors of the vehicle.

As shown on FIG. 2, electrical connectors 115, 125 establish a power connection between rechargeable battery packs 11, 12 and electric motors 211, 411, 611, via a power control unit 103. The power control unit 103 comprises motor inverters and may comprise dedicated motor controllers. Alternatively, each motor controller may form a subassembly with each electric motor 211, 411, 611.

For recharging purpose the rechargeable battery packs 11, 12 can be connected to the charger unit 108 that can be connected to a DC power battery charger 30 or to an AC power supply. The rechargeable battery packs 11, 12 are connected with a battery management system 100 (hereinafter "BMS") to control, inter alia, charge and discharge cycles of the rechargeable battery packs 11, 12.

Preferably, the rechargeable battery packs 11, 12 are connected to the charger interface 108 via a DC/XX converter 107 wherein XX is either a DC inlet (charger) or an AC inlet (power grid).

Typically, the BMS 100 monitors parameters of each rechargeable battery pack 11, 12 via dedicated monitoring units 101, 102 that are, for instance, embedded in each rechargeable battery pack 11, 12. The BMS 100 is able to communicate battery information to a HMI unit 105. For instance, BMS 100 is able to communicate information representing the State of Charge (SoC) and the state of health (SoH) of each rechargeable battery pack 11, 12 to the HMI unit 105 that, in turn, is able to display relevant battery information on a display screen (HMI) 106 inside the cabin 20 of the vehicle 1.

The SoH of each rechargeable battery pack 11, 12 can be determined, for instance, after a full recharge. Indeed, when the battery pack is charged with a constant charging voltage, the charging current progressively decreases during the charging phase, following a specific charging curve and it is possible to deduce a relationship between the SoC and the charging current. The SoC can be deduced at the end of the charging phase using this relationship.

The actual SoC of the battery pack after a full recharge may then be compared to that of the same battery pack when new, that is to say that have not been yet discharge during a discharge phase, referred below as a "new battery pack". The SoH of an "old" rechargeable battery pack can be a rate between the SoC of the actual rechargeable battery pack and the initial SoC of a new battery pack. For instance, if the SoC of the actual rechargeable battery pack corresponds to 80% of the initial SoC (of a new battery pack), the SoH of the current battery pack is determined as being equal to 80%.

Knowing the SoC of the actual rechargeable battery pack, the remaining capacity of the rechargeable battery can be determined, during operation of the vehicle and during discharge of the rechargeable battery pack, by a Coulomb method.

Other methods, implementing for instance an Extended Kalman Filter, are suitable to determine initial SoC, SoH and actual SoC of Lithium ion battery packs.

To determine the battery SoH, physical parameters that can change significantly with age are monitored by the BMS. The SoH indication is relative to the condition of a new battery, the BMS records the initial conditions or standard parameters. Counting the charge/discharge cycles of the battery is one way used as a measure of the battery usage but following parameters, single or combined could be used to derive an arbitrary value for the SoH:

Internal resistance/impedance/conductance
Capacity
Voltage
Self-discharge
Ability to accept a charge
Number of charge-discharge cycles Cell impedance or conductance are used as a basis for providing an indication of the SoH of the battery cell(s). Changes to these parameters impact battery performance such as the loss of rated capacity or increased temperature rise during operation.

Concerning now the State of Charge, the latest is determined to know the amount of energy that is left in the battery compared with the energy it had when the battery was full. It gives the operator an indication of how much longer a battery will continue to perform before it needs to be recharged. It is a measure of the short term capability of the battery. We can compare this to a car fuel tank.

Several methods are used to determine the SOC, this could be based on "Voltage Based SOC Estimation". This uses the voltage of the battery cell as the basis for calculating SOC or the remaining capacity.

Another method that could be used is "Current Based SOC Estimation" or "Coulomb Counting". The energy contained is measured in Coulombs and is equal to the integral over time of the current which delivered the charge. The remaining capacity in a cell can be calculated by measuring the current entering or leaving the cells and integrating this over time. This is done during battery discharge and charge.

We can note that the SOC reference has to be the rated capacity of a new battery. This is because the cell capacity gradually reduces as the cell ages. Towards the end of the cell's life its actual capacity will be approaching only 80% of its rated capacity and in this case, even if the cell were fully charged, its SOC would only be 80% of its rated capacity. Temperature and discharge rate effects reduce the effective capacity even further.

Advantageously, each monitoring unit 101, 102 comprises at least one current sensor (for measuring intensity) and also at least one temperature sensor. The BMS 100 is preferably arranged on-board the vehicle.

In the example, each rechargeable battery pack 11, 12 comprises several battery modules, respectively 111, 112, 113 and 121, 122, 123. In the example, the battery modules have each the same nominal voltage, which is 48V for this kind of application. Also, the battery modules are connected in parallel so that the power (and precisely the intensity) that can deliver the battery pack depends on the number of modules that includes the battery pack.

Typically, a shovel of 1 tonne does not require the same power than a shovel of 10 tonnes. Thus, this battery pack construction in the form of modules stacked in parallel allows the battery power to be easily adjusted according to the required application. It is therefore possible to have the same battery architecture for a whole range of construction vehicles.

Advantageously, each battery module 111, 112, 113 (and 121, 122, 123) comprises several battery cells (not shown), which have each a nominal voltage of 2.3V in the example. The battery cells are connected according to a special arrangement, so that the nominal voltage at the terminals of the battery module is approximately equal to 48V when the battery module is full charged.

Preferably, BMS 100 fulfills a function of balancing the State of Charge (SoC) between the battery packs 11 and 12 on-board of the vehicle. Also, the BMS 100 can also control the intensity of the current supplied by each battery pack 11, 12, and balances the currents if necessary, to make sure that each battery pack delivers the same power.

More specifically, depending at least on the actual state of charge of each rechargeable battery pack 11, 12, the battery management system (BMS) 100 determines from which rechargeable battery pack 11, 12 electric power can be drawn in order to drive the electric motors 211, 411, 611. For instance, when a difference of SoC exists between rechargeable battery packs 11, 12, electric power is drawn in priority from the rechargeable battery packs having the highest SoC. To balance discharge current, the BMS 100 may control power contactors or power switches 104 arranged on the power circuit of the vehicle 1 between the battery packs 11, 12 and the electric motors 211, 411, 611. The actual state of charge of each rechargeable battery pack 11.12 can be indirectly determined by the battery management system such as previously explained.

Also, each battery pack 11 and 12 includes advantageously a Battery Management Unit (BMU) for balancing the state of charge between the battery modules, respectively 111, 112, 113 and 121, 122, 123 on-board of the vehicle. Also, the BMU can also control the intensity of the current supplied by each battery module 111, 112, 113 (or 121, 122, 123), and balances the currents if necessary, to make sure that each battery module 111, 112, 113 (or 121, 122, 123) delivers the same power.

Preferably, each battery module 111, 112, 113 (or 121, 122, 123) includes advantageously an Electronic Control Unit (ECU) for balancing the state of charge between the battery cells. This is to ensure that each battery cell has the same SoC. Also, the ECU can also control the intensity of the current supplied by each battery cell, and balances the currents if necessary, to make sure that each battery cell delivers the same power.

A method is described below. This method consists to give a second life to used electric vehicle battery packs by reusing them as a power source for an autonomous battery charger, preferably for a mobile battery charger.

The method includes a first step a) consisting in selecting, among battery packs that have been removed from electric vehicles, at least two battery packs. In the example, the battery packs to which a second life is given are 48V Lithium-ion battery packs and preferably battery packs that have been removed from construction equipment vehicles (articulated haulers, wheel loaders, backhoe loaders, excavator, shovel, etc.).

The vehicles in question are either rechargeable hybrid vehicles (including a plug-in hybrid powertrains) or full-electric vehicles, which include rechargeable battery packs.

In the example, preliminary steps consist, for each electric vehicle, in determining a state of health of each battery pack of the vehicle and, when the state of health of a battery pack drops below a given threshold thSoH, in removing said battery pack from the vehicle. The SoH of each removed battery is recorded in a memory, such as in a register. Typically, this could be done by an operator when removing an old battery pack from a vehicle.

The given threshold SoH value (thSoH) is comprised between 70 and 90% of the initial SoH (when the battery pack is new), preferably between 80 and 90% of the initial SoH.

The determined given thSoH allows the rechargeable battery packs to be used in a vehicle during a first period of their lifetime, i.e. a first life, where they are the most powerful in order to cover specific high power demand from electric motors 211, 411, 611 of the vehicle 1.

Due to the fact that, according to the invention, the battery packs may have a second life as a source of energy in a battery charger, usability of removed rechargeable battery packs 11, 12 is increased and it becomes economically possible to remove battery packs from the vehicle 1 before they reach a state of health level of 80% with respect to the state of health of a new battery pack. Even more, it also becomes economically viable to remove current battery packs from the vehicle and to replace them by new ones as soon as one of them has reached a state of health level of 90% with respect to the initial state of health of a new battery pack. Removing current battery packs 11, 12 and replacing them by new ones when they have reached a state of health level of 90% enables the vehicle, especially construction equipment vehicles, to benefit from very efficient battery packs and to draw more power from battery packs in order to meet, for instance, with specific situations where higher power is demanded by electric motors.

Generally, the steps of determining the SoH of the battery pack(s) on-board the vehicle, of comparing the SoH to a certain threshold and of sending an alert signal to the driver when the SoH drops below said threshold are performed by the BMS. Typically, the SoH and the SoC of each battery pack is preferably displayed on the trip computer fitted inside the cabin 20, which includes the display screen (HMI) 106.

However, such steps could also be done by an operator using a hand-held scan tool. It could also be a PC-based On-Board Diagnostics (OBD) analysis tool.

According to a first embodiment, step a) consists in selecting battery packs that have the same State of Health (SoH) or approximately the same state of health. It could be considered that two battery packs have approximately the same SoH when the difference between their SoH is less than 10%, preferably less than 5%.

For example, the selected battery packs are battery packs that have been removed from one and the same electric vehicle.

Alternatively, the selected battery packs may come from different electric vehicles. In this case, they have often not the same SoH. Indeed, the SoH threshold below which an application deems a particular battery pack unsuitable is also arbitrary; a given application may accept a battery with a SoH of 50% and above, while a more critical application may only accept batteries with a SoH of 90% and above. Accordingly, the SoH threshold below which a battery pack must be replaced depends on the characteristics of the construction equipment vehicle that is considered.

Obviously, it is preferable to select battery packs that have the same characteristics, in particular the same power. In this respect, the selected battery packs include advantageously the same number of modules. If not, an additional step could consist in balancing the number of modules contained in each selected battery pack, so that each of the battery packs, in the end, includes the same number of battery modules.

The method includes a second step b) consisting in balancing the voltage between the selected battery packs, in order that the selected battery packs have the same State of Charge (SoC). For example, this could involve transferring energy between the most charged battery pack and the least charged battery pack. Also, it is possible to consider recharging the battery packs to the maximum, so that their SoC is 100% for each one, that is why an additional step posterior to step a) and anterior to step b) could consist in recharging the selected battery packs to their maximum capacity.

This could be done, for instance, thanks to the charger interface 108 and the DC/XX converter 107.

In a third step c), the battery packs 11, 12 are integrated into a battery charger 30 (See FIG. 3), meaning that a second life is given to these battery packs.

Typically, the battery charger 30 is an autonomous battery charger; i.e. that can provide electrical energy without being connected to a power grid. It comprises, as a power source, at least two battery packs, which are used electric vehicle battery packs to which a second life is given, according to the method described supra.

Preferably, the battery charger 30 includes wheels and a hitch system enabling the battery charger 30 to be towed by a vehicle (not shown).

The battery charger 30 (see FIG. 3) is designed to recharge rechargeable batteries, for example Lithium-ion rechargeable batteries on-board electric vehicles. The battery packs of the charger are re-used as such, which means that they have not been rebuilt from battery cells selected from different used battery packs that have been dismantled (to select cells that can be reused to rebuilt new battery packs from cells that can't be reused).

It is to be noted that a remaining state of health of 70% is insufficient to use the battery packs 11, 12 in a first life cycle (first use) as a power source in a vehicle to drive its electric motors but is sufficient in a second life cycle (second use) of the rechargeable battery packs 11, 12 as a source of electrical energy in a battery charger 30.

The charger 30 may comprise further rechargeable battery packs, more than two, removed from different vehicles provided they have approximately, at the time of their removing from the vehicles, the same state of health as the first rechargeable battery pack 11 and the second rechargeable battery pack 12. Thanks to the invention rechargeable battery packs 11, 12 removed from a vehicle 1 such as a construction equipment vehicle can be easily reused and have a second life cycle as a source of electrical energy in a battery charger. Thanks to the invention lifetime of such a battery packs is extended. Furthermore, it becomes easier and less expensive to build a battery charger whose source of electrical energy is formed by recycled rechargeable battery packs.

It is to be understood that the present invention is not limited to the embodiments described above and illustrated in the drawings; rather, the skilled person will recognize that many changes and modifications may be made within the scope of the appended claims.

The invention claimed is:

1. Method that consists to give a second life to used electric vehicle battery packs by reusing them as a power source for an autonomous battery charger, wherein the method includes successive steps consisting in:

a. selecting, among battery packs that have been removed from electric vehicles, at least two battery packs;
b. balancing the voltage between the selected battery packs, in order that the selected battery packs have the same State Of Charge (SOC); and
c. integrating the selected battery packs into the battery charger.

2. Method according to claim 1, wherein step a) consists in selecting battery packs that have the same State Of Health (SOH) or approximately the same state of health.

3. Method according to claim 1, wherein step a) consists in selecting battery packs that have been removed from one and the same electric vehicle.

4. Method according to claim 1, wherein the battery packs to which a second life is given are 48V Lithium-ion battery packs.

5. Method according to claim 1, wherein the battery packs to which a second life is given have been removed from construction equipment vehicles.

6. Method according to claim 1, wherein the method includes preliminary steps that consist, for each electric vehicle, in:
determining a state of health of each battery pack of the vehicle;
when the state of health of a battery pack drops below a certain threshold, removing said battery pack from the vehicle; and
recording the state of health of each removed battery in memory.

7. Method according to claim 6, wherein said certain threshold is comprised between 70 and 90% of the initial SoH of the battery pack.

8. Method according to claim 6, wherein the state of health of the battery packs is determined between the end of a recharging phase and before a new discharging phase.

9. Method according to claim 1, wherein the method includes an additional step posterior to step a) and anterior to step b) that consists in recharging the selected battery packs to their maximum capacity.

10. Method according to claim 1, wherein step a) consists in selecting battery packs that have the same characteristics.

11. Method according to claim 1, wherein each battery pack includes several battery modules connected in parallel and each battery module includes several battery cells and in that the method includes an additional step consisting in balancing the number of modules contained in each selected battery pack, so that each of the battery packs of the battery charger includes the same number of battery modules.

12. Method according to claim 1, wherein the battery packs selected at step a) are non-rebuilt battery packs (i.e. battery packs that have not been rebuilt).

13. An autonomous battery charger, comprising, as a power source, at least two battery packs, wherein the two battery packs are used electric vehicle battery packs to which a second life is given, according to the method of claim 1.

14. Battery charger according to claim 13, wherein the battery charger includes wheels and a hitch system enabling the battery charger to be towed by a vehicle.

15. Method according to claim 7, wherein said certain threshold is between 80 and 90% of the initial SoH.

16. Method according to claim 11, wherein step a) includes selecting battery packs that have a same power and/or a same nominal voltage.

\* \* \* \* \*